(12) United States Patent
Skogman

(10) Patent No.: US 6,975,661 B2
(45) Date of Patent: Dec. 13, 2005

(54) METHOD AND APPARATUS FOR PRODUCING VCSELS WITH DIELECTRIC MIRRORS AND SELF-ALIGNED GAIN GUIDE

(75) Inventor: Richard A. Skogman, Plymouth, MN (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 09/881,167

(22) Filed: Jun. 14, 2001

(65) Prior Publication Data

US 2002/0191659 A1 Dec. 19, 2002

(51) Int. Cl.[7] ............................................... H01S 5/00
(52) U.S. Cl. ........................... 372/46; 372/43; 372/44; 372/45
(58) Field of Search ................................... 372/43–46

(56) References Cited

U.S. PATENT DOCUMENTS

| | | | |
|---|---|---|---|
| 5,115,441 A | | 5/1992 | Kopf et al. |
| 5,283,447 A | * | 2/1994 | Olbright et al. ............ 257/85 |
| 5,390,210 A | | 2/1995 | Fouquet et al. |
| 5,537,666 A | | 7/1996 | Mori et al. |
| 5,587,335 A | | 12/1996 | Mori et al. |
| 5,903,589 A | | 5/1999 | Jewell |
| 6,014,400 A | | 1/2000 | Kobayashi |
| 6,031,243 A | | 2/2000 | Taylor |
| 6,057,560 A | | 5/2000 | Uchida |

(Continued)

FOREIGN PATENT DOCUMENTS

| | | |
|---|---|---|
| EP | 0 933 842 B1 | 7/2003 |
| WO | WO 01/95443 A1 * | 12/2001 |

OTHER PUBLICATIONS

Lott, J.A., et al., Partial Dielectric Stack Distributed Bragg Reflectors for Red Vertical Cavity Surface Emitting Laser Arrays IEEE Photonics Technology Letters, Dec. 1994, No. 12.*

Bowers, J. et al., "Fused Vertical Cavity Lasers With Oxide Aperture," Final Report 1996–97 for MICRO project 96–042, 4 pages (1996).

Chang-Hasnain, C.J., "VCSELs: Advances and Future Prospects," 8 pages (2000).

Deng, H. et al., "Oxide-confined vertical-cavity laser with additional etched void confinement," *Electronics Letters*, vol. 32, No. 10, pp. 900–901 (May 9, 1996).

International Search Report for International Application No. PCT/US 02/18587, 8 pages, (Jun. 13, 2002).

Jacquet, J., "Project AC 024, Vertical, VERtical cavity laser Technology for InterConnection and Access Links," Final Report on 1.3/1.55 μm VCSELs, 62 pages (Dec. 1998).

(Continued)

*Primary Examiner*—Tan Ho
*Assistant Examiner*—Leith A Al-Nazer
(74) *Attorney, Agent, or Firm*—Workman Nydegger

(57) ABSTRACT

The invention includes a method of fabricating a laser device, that includes: depositing a photoresist on epitaxially grown layers, patterning said photoresist to form an aperture area, depositing a dielectric material on said patterned photoresist, depositing a liftoff layer on said dielectric material, removing portions of said dielectric material and liftoff layer that border said aperture area, implanting regions of the epitaxially grown layers bordering said aperture area, and depositing a metal layer on said dielectric material. The invention also includes a device including: a substrate comprising epitaxial layers and an aperture area, a dielectric mirror formed on top of said aperture area and an implanted region within said epitaxial layers, said implanted region bordering said aperture area.

19 Claims, 5 Drawing Sheets

U.S. PATENT DOCUMENTS

| | | | | |
|---|---|---|---|---|
| 6,064,683 | A | * | 5/2000 | Johnson ......................... 372/46 |
| 6,185,241 | B1 | * | 2/2001 | Sun .............................. 372/96 |
| 6,208,680 | B1 | | 3/2001 | Chirovsky et al. |
| 6,238,944 | B1 | * | 5/2001 | Floyd ........................... 438/45 |
| 6,365,427 | B1 | | 4/2002 | Gauggel et al. |
| 6,493,368 | B1 | | 12/2002 | Chirovsky et al. |
| 6,493,373 | B1 | | 12/2002 | Boucart et al. |
| 6,507,595 | B1 | | 1/2003 | Kapon et al. |
| 6,549,556 | B1 | | 4/2003 | Hwang et al. |

OTHER PUBLICATIONS

Lott, J.A. et al., "Partial Top Dielectrics Stack Distributed Bragg Reflectors for Red Vertical Cavity Surface Emitting Laser Arrays," *IEEE Photonics Technology Letters*, vol. 16, No. 12, pp. 1397–1399 (Dec. 1994).

Morgan, R.A. et al., "Hybrid dielectric/AlGaAs mirror spatially filtered vertical cavity top–surface emitting laser," *Applied Physics Letters*, vol. 66, No. 10, pp. 1157–1159 (Mar. 6, 1995).

International Search Report, dated Aug. 19, 2003, relative to PCT application No. PCT/US 02/18587, the foreign equivalent to the Instant U.S. Appl. No. 09/881,167.

Deng et al. "Oxide–confined vertical–cavity laser with additional etched void confinement". Electronics Letters, IEE Stevenage, GB, vol. 32, No. 10, May 9, 1996, pp. 900–901.

Lott J A et al. "Partial top dielectric stack distributed bragg reflectors for red vertical cavity surface emitting laser arrays" IEEE Photonics Technology Letters, IEEE Inc. New York vol. 6, No. 12, Dec. 1, 1994, pp. 1397–1399.

Morgan et al. "Hybrid dielectric/algaas mirror spatially filtered vertical cavity top–surface emitting laser" Applied Physics Letters, American Institute of Physics. New York, US, vol. 66, No. 10, Mar. 6, 1995, pp. 1157–1159.

* cited by examiner

METHOD AND APPARATUS FOR PRODUCING VCSELS WITH DIELECTRIC MIRRORS AND SELF-ALIGNED GAIN GUIDE

FIELD OF THE INVENTION

The invention relates generally to vertical cavity surface emitting lasers (VCSELs) and methods for producing these lasers. More specifically, the invention relates to methods for the fabrication of low resistance, small diameter, low threshold current laser devices.

BACKGROUND OF THE INVENTION

Reducing electrical resistance and threshold current is of primary importance in producing highly efficient and reliable vertical cavity surface emitting laser (VCSEL) devices.

The electrical resistance of a VCSEL can be lowered by reducing the resistance of the materials used to fabricate the VCSEL. The physical structure of the VCSEL can also be optimized to reduce resistance by altering the width and length of the conduction path.

A large portion of the overall electrical resistance of the VCSEL may be attributed to the semiconductor distributed Bragg reflectors (DBR) used as the input and output mirrors of the laser cavity. One means of reducing resistance of the DBR components is to replace the top semiconductor DBR mirror with a dielectric thin film DBR. Structurally, this situates a dielectric thin film close to the active region of the device. This approach raises concern because of the difference in coefficients of thermal expansion between the dielectric thin film and the other materials used in the VCSEL. The difference in coefficients of thermal expansion causes strains between the materials and can complicate fabrication processes and device operation.

Threshold current may be reduced by reducing the diameter of the VCSEL aperture. A smaller diameter VCSEL aperture has a relatively lower threshold current when compared to devices with larger diameter VCSEL apertures. VCSEL aperture diameter is largely dependent on the means by which the current confining aperture is fabricated. Small diameter apertures are often difficult to fabricate with ion implantation techniques because of proton straggle. The phenomena of "straggle" results from the scatter of protons through the crystal lattice of conventional semiconductor DBRs. Smaller devices also have more critical alignment tolerances, which, in turn, are dependent on available photolithographic processes.

Two exemplary patents which disclose VCSEL devices are Mori et al., U.S. Pat. Nos. 5,537,666 and 5,587,335. Mori et al. teach the fabrication of laser devices by the sequential formation of semiconductor layers, including a multi-layer semiconductor mirror, a cladding, and an active layer on a substrate through organic metal vapor growth processes. However, Mori et al. do not address the problems of VCSELs beyond those solutions discussed above.

As a result, there remains a need for processes and resulting devices that reduce electrical resistance and threshold current.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

In accordance with the invention, there is provided a method of fabricating a laser including the steps of: depositing a photoresist on the substrate, patterning the photoresist to form an aperture area, depositing a dielectric material on the patterned photoresist, depositing a liftoff layer on the dielectric material, removing portions of the dielectric material and liftoff layer that border the aperture area, implanting regions of the substrate bordering the aperture area, and depositing a metal layer on the substrate.

In accordance with another aspect of the invention there is provided a laser including: a substrate comprising epitaxial layers and an aperture area, a dielectric mirror formed on top of the aperture area, and an implanted region within the substrate, the implanted region bordering the aperture area.

The invention provides a small diameter, low threshold current VCSEL with reduced resistance in the top DBR. At least 90% of the top semiconductor DBR is replaced by a dielectric mirror fabricated over only the output aperture of the VCSEL. Device current has only to pass through a few layers of the high resistance semiconductor DBR. The real extent of the dielectric mirror is never larger than the laser aperture throughout fabrication. As a result, a minimum amount of stress is exerted on the device.

At the same time, the invention provides an aligned gain guide while at the same time limiting photolithography steps. Implant straggle is also reduced as most of the top semiconductor DBR material has been eliminated. As a result, a lower energy implant can be used, allowing for the previously deposited dielectric mirror to function as a self-aligned implant mask. The result is potentially a smaller current confining aperture.

In accordance with one aspect of the invention, a partially fabricated VCSEL type epitaxial laser structure is fabricated in a substrate using Molecular Beam Epitaxy (MBE) or Metal Organic Vapor Chemical Deposition (MOVCD). A photoresist is applied to the substrate and developed to form the design for the VCSEL. The dielectric layer is then deposited over the substrate. Lift-off steps remove the portion of the dielectric material not positioned over the aperture of the partially fabricated VCSEL. The substrate is then subjected to ion implantation, or other confinement technique, at a level sufficient to provide a current confining area near the VCSEL active region. An alternative confinement technique suitable for use in the present invention is disclosed in U.S. Pat. No. 5,903,588 (Guenter et al.), which is incorporated by reference thereto. The dielectric mirror acts as an ion implant mask, keeping the area directly below the mirror (the lasing area of the VCSEL) free from implant damage. The dielectric mirror functions as an implant mask because the implant energy is low. Lower implant energies can be used because of the use of the dielectric mirror, which allows for the reduced thicknesses of the device.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE FIGURES

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

It should be understood that the drawings are not necessarily to scale and that the embodiments are illustrated using graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PREFERRED EMBODIMENT

While FIGS. 1 through 10 represent single devices, it should be understood that numerous devices can be fabricated on a substrate, for example, in an array arrangement. Additionally, it should be understood that FIGS. 1 through 10 are sectional views, therefore illustrations depicted in FIGS. 1 through 10 can extend into and out of the drawings.

Figure 1:
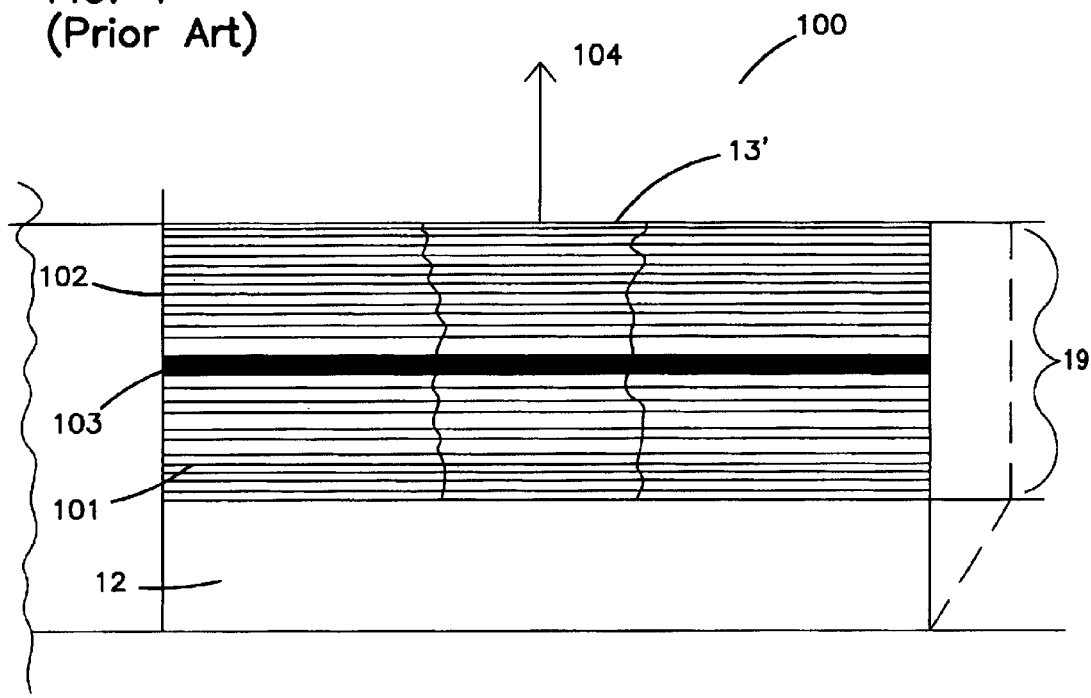
FIG. 1 represents a vertical cross section of a vertical cavity surface emitting laser (VCSEL).

FIG. 1 depicts a VCSEL 100 of the prior art. As shown in FIG. 1, the VCSEL 100 includes a number of elements: substrate 12, and epitaxial layers 19, which comprises a bottom stack of semiconductor distributed Bragg reflectors (DBR) 101, a top semiconductor DBR stack 102, and an active region 103. Light output 104 is perpendicular to the substrate 12 and is emitted from VCSEL 100 from the laser area 13'.

VCSEL 100 is fabricated by growing epitaxial layers 19 on the substrate 12. First, bottom semiconductor DBR stack 101 is grown. For example, bottom semiconductor DBR stack 101 can be made of pairs of alternating layers of aluminum$_{(x)}$ gallium$_{(1-x)}$ arsenide where each of the layer pairs is of a distinct x-value. Generally, the bottom semiconductor DBR stack 101 is doped. Active region 103, which is positioned over bottom semiconductor DBR stack 101, is also made of a variety of layers and is commonly made of aluminum gallium arsenide and gallium arsenide. On top of active region 103, is positioned top semiconductor DBR stack 102. Generally, top semiconductor DBR stack 102 is similar to bottom semiconductor DBR stack 101 except that it is oppositely doped. The active region 103 is typically designed to be $\lambda/n$ in thickness, where $\lambda$ is the emission wavelength and n is the material index of refraction at that wavelength. This equates to active region 103 being on the order of 200 nm thick (for a VCSEL that emits visible light). Because of the small thickness of the active region 103, the photons do not experience significant gain as they propagate through the cavity. Therefore, bottom semiconductor DBR stack 101 and top semiconductor DBR stack 102 function to create a coherent reflection of light from the active region 103, thereby maintaining and even increasing light output 104 from active region 103.

The specific materials utilized and the configuration of the layers are chosen depending on the specific wavelength and operating parameters desired in the final device.

Figure 2:
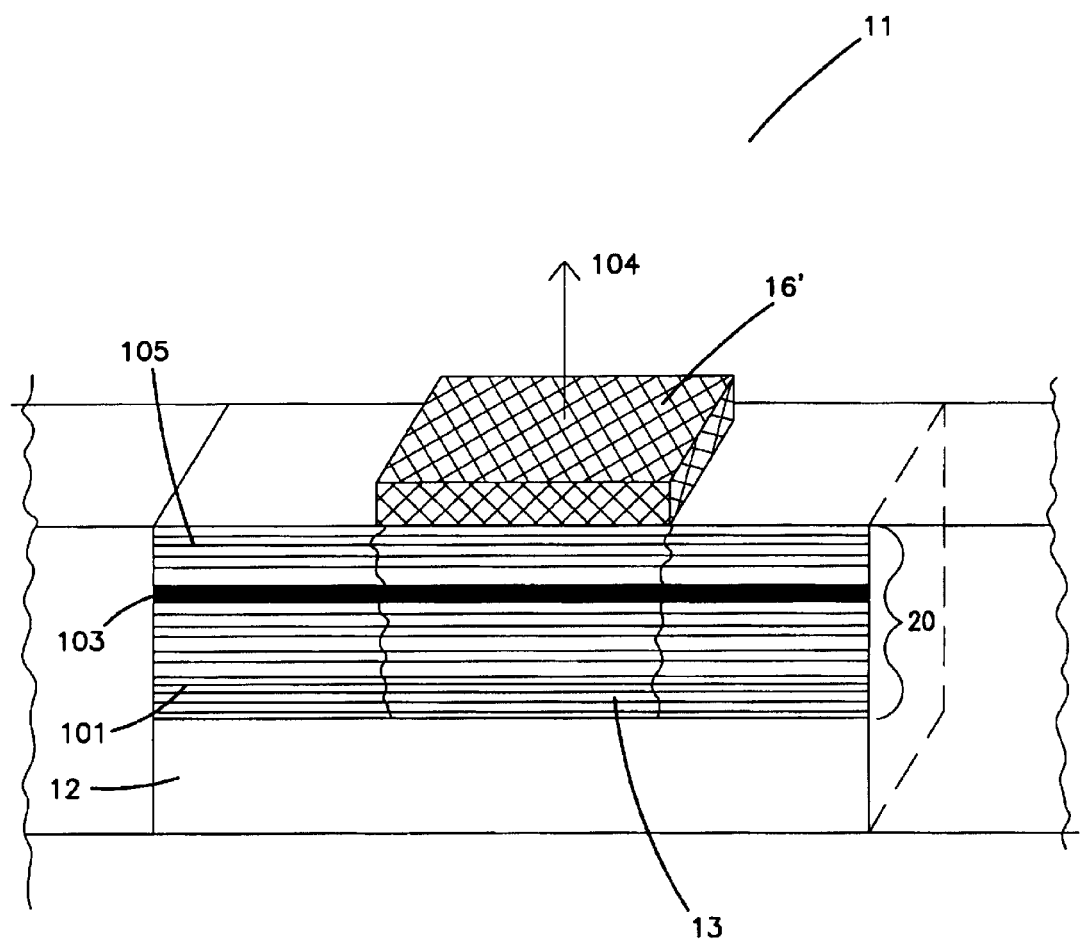
FIG. 2 represents a vertical cross section of a vertical cavity surface emitting laser (VCSEL) in accordance with one aspect of the invention.

FIG. 2 depicts a device 11, which can be a VCSEL, in accordance with one aspect of the invention. The device 11 includes: substrate 12; epitaxial layers 20, which comprises a bottom semiconductor DBR stack 101, an active region 103, and a partial top semiconductor DBR stack 105; and a dielectric mirror 16'.

Device 11 is fabricated by growing epitaxial layers 20 on substrate 12. First, the bottom semiconductor DBR stack 101 is grown. For example, the bottom semiconductor DBR stack 101 can be made of layers of aluminum gallium arsenide. Generally, the bottom semiconductor DBR stack 101 is doped. Active region 103, which is positioned on top of bottom semiconductor DBR stack 101, is also made of a variety of layers and is commonly made of aluminum gallium arsenide and gallium arsenide. On top of active region 103 is positioned partial top semiconductor DBR stack 105.

Generally, partial top semiconductor DBR stack 105 is made of similar materials as bottom semiconductor DBR stack 101 except that it is oppositely doped. Partial top semiconductor DBR stack 105 is similar to top semiconductor DBR stack 102 of VCSEL 100, except that it is not a complete top semiconductor DBR stack 102. A partial top semiconductor DBR stack as used herein means a top semiconductor DBR stack comprising less than the normal number of epitaxial layer pairs (e.g., from 2 to 6 layers compared to 30 to 40 layers). In one embodiment of the invention, the minimum number of epitaxial layers making up partial top semiconductor stack 105 is determined in part by the distance necessary to isolate the active region 103 from a highly doped top layer of partial top DBR stack 105. In this embodiment of the invention, there is a minimum of four individual layers in partial top DBR stack 105. Alternatively, the distance necessary for isolation can also be given as at least about 1500 angstroms.

Dielectric mirror 16' is positioned on top of partial top semiconductor DBR stack 105. Dielectric mirror 16' serves the function of the missing portion of top semiconductor DBR stack 102. Device 11 functions similarly to VCSEL 100 in that the photons are produced in active region 103 and are coherently reflected by bottom semiconductor DBR stack 101 and partial top semiconductor DBR stack 105. Dielectric mirror 16' plus partial top semiconductor DBR stack 105 form a complete top DBR functioning in the same manner as a complete top semiconductor DBR stack 102.

Figure 9:
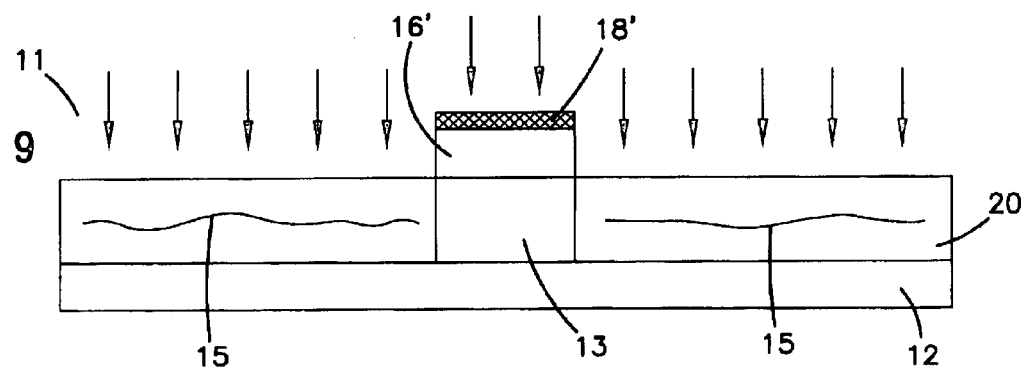
Figure 10:
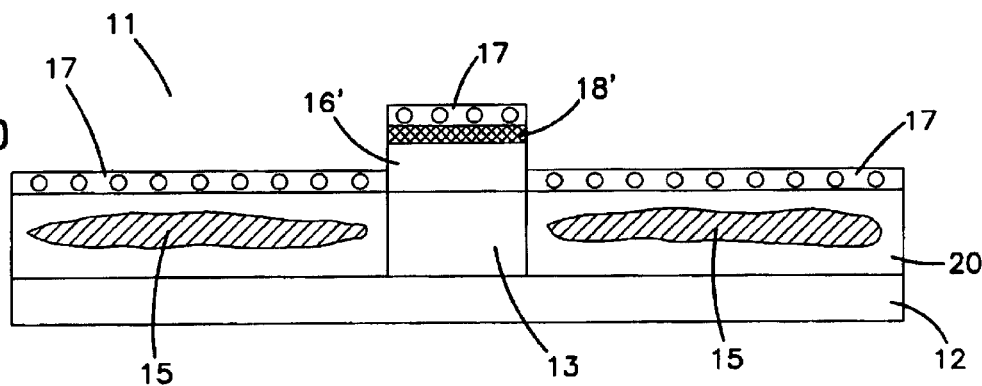
Figure 11:
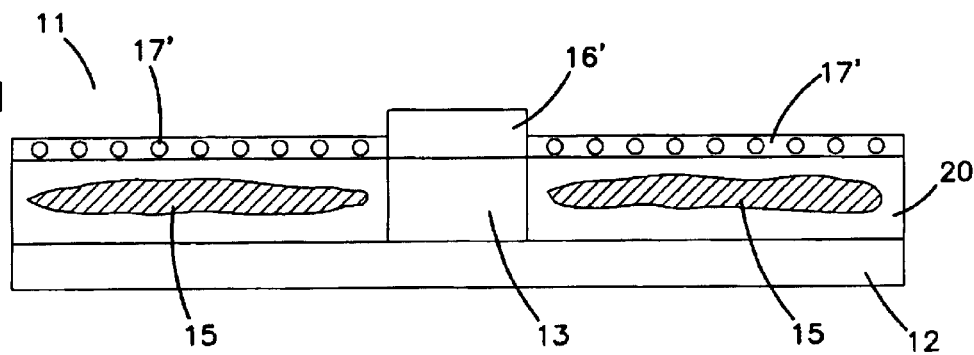

Dielectric mirror 16' also functions as a guide to direct ion implantation around the laser area 13 (made up of a portion of substrate 12, bottom semiconductor DBR stack 101, active region 103, and partial top semiconductor DBR stack 105) to form implant regions 15 (as shown in FIGS. 9–11).

Device 11 in accordance with one aspect of the invention has a number of advantages that VCSEL 100 does not. The material that makes up the semiconductor DBR stacks has a high electrical resistance. The device 11 of the invention decreases the overall resistance because the current does not have to pass through a complete top semiconductor DBR stack. Laser threshold current is also lowered in the device of the invention 11, because smaller laser apertures can be utilized. Dielectric mirror 16' serves as an implant guide for ion implantation, and lower energy implantation can be used to implant around a smaller area without ion straggle becoming a problem.

Device

An exemplary device 11 in accordance with one aspect of the invention is depicted in FIGS. 2 and 10. A device 11 in accordance with the invention includes a substrate 12, a laser area 13, a dielectric mirror 16', and implant regions 15 (as shown in FIGS. 9–11).

Laser area 13 for use in the invention is depicted in FIG. 2 and can be compared with FIG. 1, which depicts a fully fabricated VCSEL. The laser area 13 differs from a fully fabricated VCSEL in that the complete top semiconductor DBR stack 102 is not present. Generally, about 5% of a complete top semiconductor DBR stack is present in laser area 13 of device 11. Laser area 13 can be manufactured on substrate 12 by using any generally accepted method of VCSEL fabrication. Fabrication of laser area 13 comprises the growth of epitaxial layers 20 and later ion implantation or other confinement technique and can be done by any generally accepted method. Exemplary methods of making laser area 13 can be extrapolated from U.S. Pat. Nos. 5,475,701 ("Hibbs-Brenner") and 5,893,722 ("Hibbs-Brenner et al.").

A device in accordance with one aspect of the invention also includes a dielectric mirror 16'. Dielectric mirror 16' serves the function of the part of the second, complete DBR stack that has not been as completely formed to the extent as in VCSEL 100 when compared to laser area 13 of device 11. Dielectric mirror 16' is positioned only over the aperture of laser area 13. Dielectric mirror 16' can be formed by any conventional method as will become apparent to those skilled in the art. The material that comprises dielectric mirror 16' can be chosen from any commonly utilized compounds, including but not limited to, silicon dioxide ($SiO_2$), titanium dioxide ($TiO_2$), and combinations thereof.

Dielectric mirror 16' and its formation also serve as a self-aligned implant mask for implantation of the implant regions 15 of the device 11. This allows low energy (shallow) implantation into substrate 12, which reduces straggle and protects laser area 13 from being damaged during implantation. Implant regions 15 can be formed by any conventional method and any variety of ions can be implanted, including but not limited to, hydrogen.

A device 11 in accordance with one aspect of the invention can be further characterized and explained by reference to a method of making the device as discussed below.

Processing

FIGS. 3 through 10 represent one method of fabricating a device in accordance with an aspect of the invention. FIGS. 3 through 10 are sectional views, and it should, therefore, be appreciated that the illustrations depicted in FIGS. 3 through 10 can extend into and out of the drawings, thereby allowing for the depiction of arrays of the devices.

Figure 3:
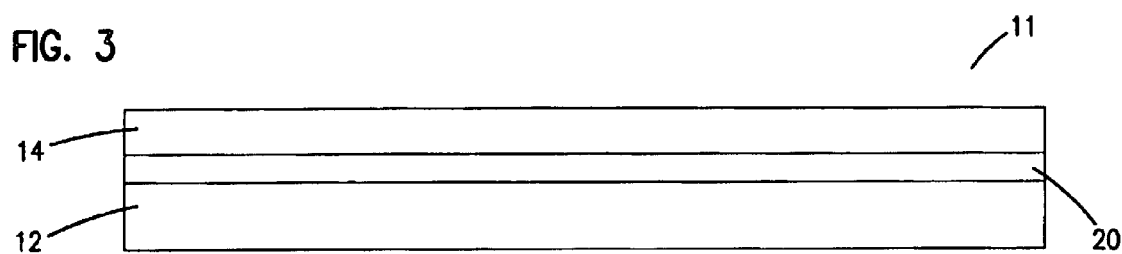
FIGS. 3 through 11 illustrate a fabrication method and resulting device in accordance with one aspect of the invention.

FIG. 3 depicts a substrate 12 of device 11 with epitaxially grown layers 20 comprising the bottom semiconductor DBR stack 101, the active region 103, and the partial top semiconductor DBR stack 105 (as seen in FIG. 2).

Epitaxially grown layers 20 can be fabricated by modifying any generally accepted method of fabricating a VCSEL in accordance with the teachings of the present invention. As noted above, Hibbs-Brenner and Hibbs-Brenner et al. both offer examples of a fabrication process that could be modified. A modified process according to Hibbs-Brenner will be offered as an example of one method for fabricating epitaxial layers 20 in accordance with the invention although it will be apparent to those skilled in the art that other methods can be employed.

Figure 4:
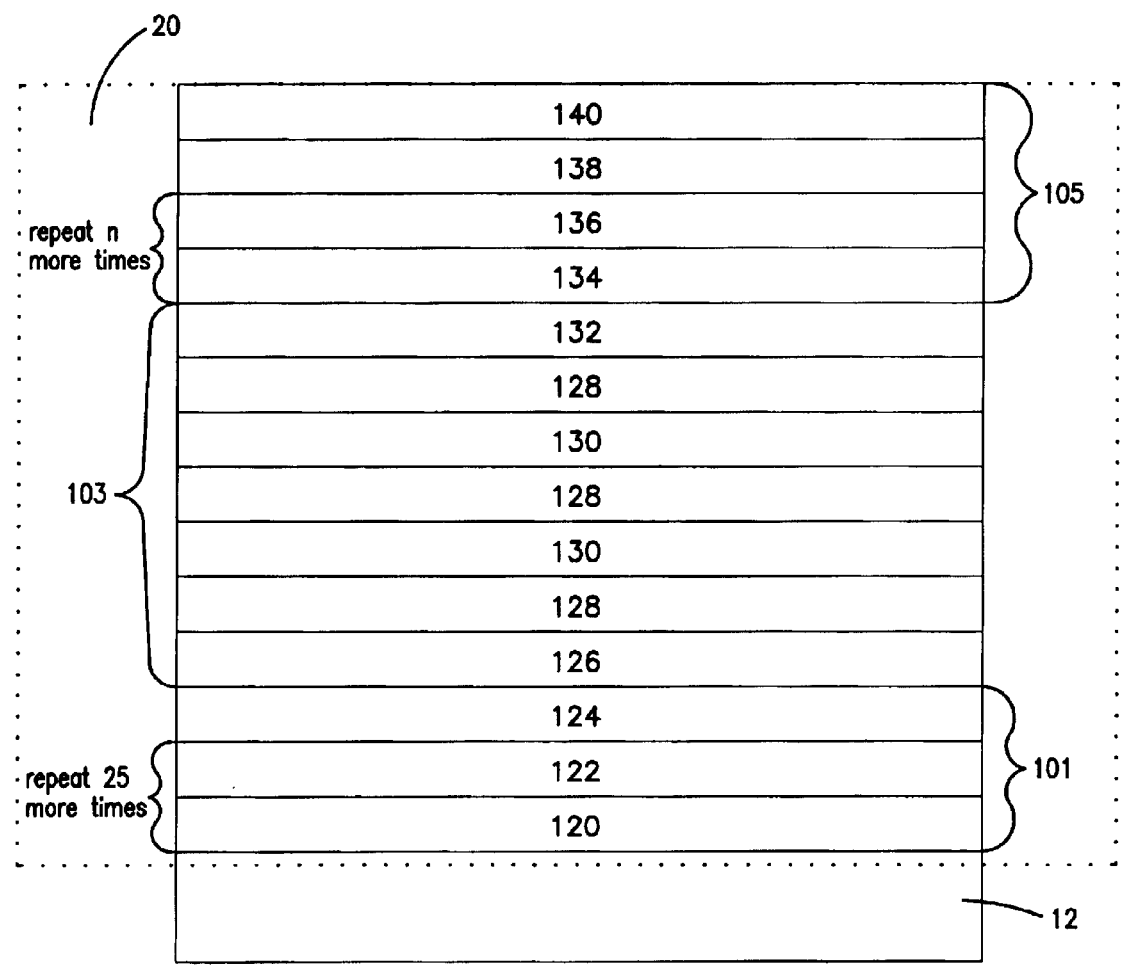

Epitaxially grown layers 20 comprise bottom semiconductor DBR stack 101, active region 103, and partial top semiconductor DBR stack 105, seen in FIG. 4.

Referring to FIG. 4, an exemplary configuration for bottom semiconductor DBR stack 101, which is situated on substrate 12, comprises layers 120, 122 (preferably repeated, for example, a total of 25 times for a 850 nm laser) and 124. Bottom semiconductor DBR stack 101 begins with a 60.5 nanometer (nm) layer of $Al_{0.15}Ga_{0.85}As$ material, layer 120. Situated on top of that is a 71.1 nm layer of AlAs, layer 122. The thickness of these layers is dictated by $\lambda/4n$, where $\lambda$ is the wavelength (850 nm) and n is the index of refraction of the layer. In this instance, layers 120 and 122 are repeated 25 times for a total of 26 alternating layers. Positioned on top of the 26 alternating layers is a layer of $Al_{0.15}Ga_{0.85}As$, layer 124.

An exemplary configuration of active region 103, which is situated on bottom semiconductor DBR stack 101, comprises layers 126, 128, 130, 128, 130, 128, and 132. Active region 103 can comprise an $Al_{0.25}Ga_{0.75}As$ layer of appropriate thickness, layer 126. Positioned on top of layer 126 is first layer 128 of GaAs. Next is first layer 130 of $Al_{0.25}Ga_{0.75}As$. Situated on layer 130, is second layer 128 of GaAs. Positioned on second layer 128 is second layer 130 of $Al_{0.25}Ga_{0.75}As$. Situated on second layer 130 is third layer 128 of GaAs. On third layer 128 is layer 132 of $Al_{0.25}Ga_{0.75}As$.

An exemplary configuration of partial top semiconductor DBR stack 105, which is situated on top of active region 103, can comprise repeating layers 134 and 136, layer 138, and layer 140. Partial top semiconductor DBR stack 102 begins with layer 134, which can be an AlAs layer. Positioned on layer 134 is another $Al_{0.15}Ga_{0.85}$, layer 136. Layers 134 and 136 are then repeated x times for a total of x+1 alternating layers. An AlAs, layer 138 is then formed. Positioned on layer 138 is a layer of $Al_{0.15}Ga_{0.85}As$, layer 140.

The value of x, which defines how many layers make up partial top semiconductor DBR stack 105 can be varied. x can have a value of from about 0 to 22 depending on the application. Preferably, x has a value of from about 0 to 10. More preferably, x has a value of from about 1 to 5, e.g. 3, which would mean that partial top semiconductor DBR stack 105 could have 4 alternating layers. In embodiments containing a highly doped top layer of partial top DBR stack 105, partial top DBR stack 105 comprises at least about 4 alternating layers.

Referring to FIG. 3, the next step in a method in accordance with one aspect of the invention is the application of photoresist layer 14. Photoresist layer 14 is spun over the epitaxial layers 20 which are positioned on the substrate 12 of device 11. Photoresist layer 14 can be of any suitable material and applied by any method known to those skilled in the art.

Figure 5:
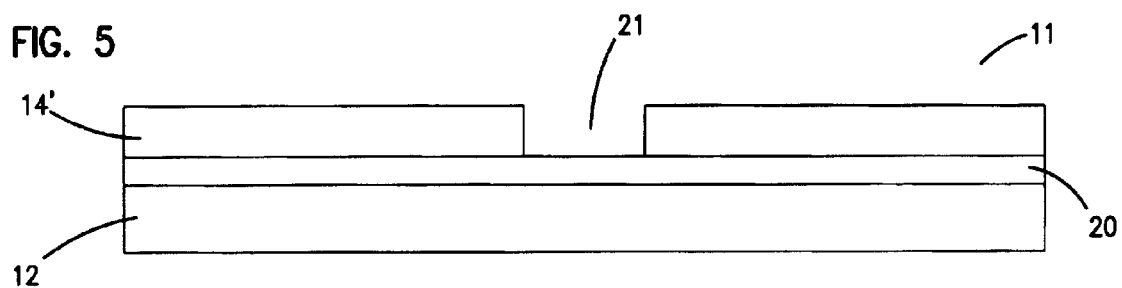

Referring to FIG. 5, the next step in a method of producing a device of the invention is patterning the photoresist layer 14. Photoresist layer 14 is patterned to form patterned photoresist layer 14' of device 11. Patterned photoresist layer 14' comprises photoresist layer 14 with the area directly above laser area 13 removed, forming aperture area 21. Aperture area 21 is generally on the order of 2 to 25 µm, preferably is from 5 to 15 µm, and more preferably is about 10 µm. Patterned photoresist layer 14' can be formed from photoresist layer 14 by any method known to those skilled in the art.

Figure 6:
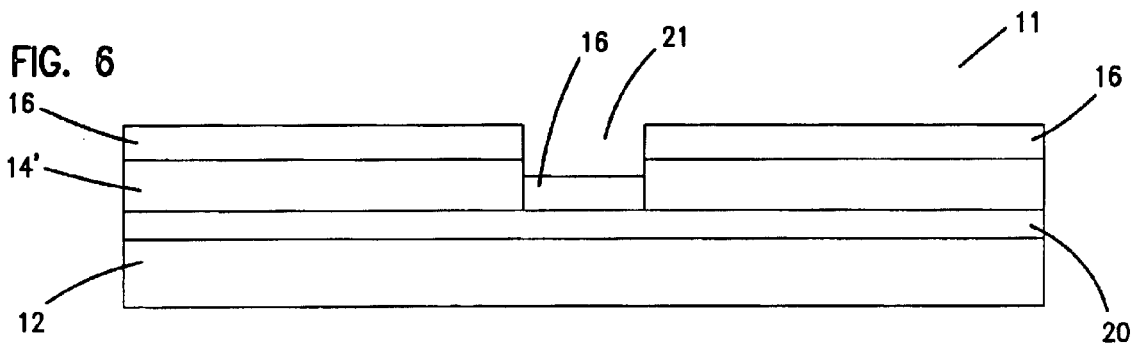

Referring to FIG. 6, the next step in a method of producing a device of the invention is deposition of the dielectric material. Dielectric layer 16 of device 11 is deposited across substantially the entire surface of the epitaxial layers 20, thereby contacting the patterned photoresist layer 14' and layers 20 directly above aperture area 21. Dielectric layer 16 can be formed by any method known to those skilled in the art, including but not limited, to Chemical Vapor Deposition (CVD), Low Pressure Chemical Vapor Deposition (LPCVD), Plasma Enhanced Chemical Vapor Deposition (PECVD), or the like. Dielectric layer 16 can be formed from any combination of materials generally utilized as a dielectric mirror, including but not limited to, silicon dioxide ($SiO_2$), titanium dioxide ($TiO_2$), silicon nitride ($Si_3N_4$), and combinations thereof. The thickness of dielectric layer 16 is generally from about 3,000 to 8,000 angstroms (Å), depending on the respective refractive indices of the mirror materials.

Figure 7:
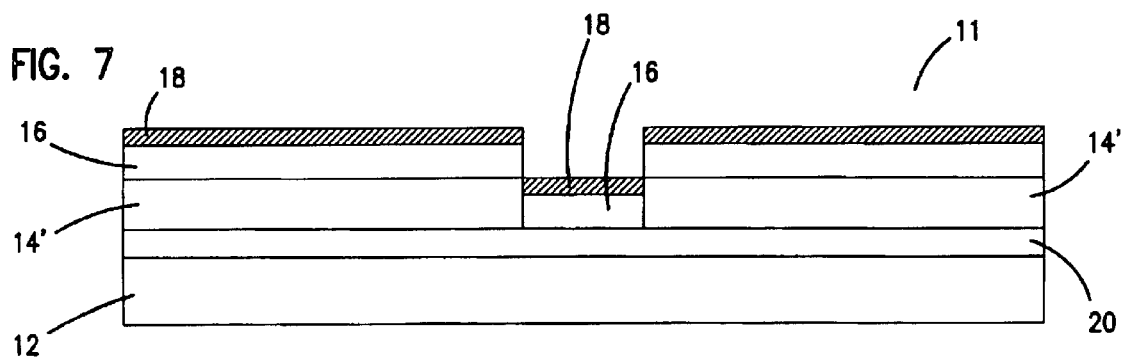

Referring to FIG. 7, the next step in a method of producing a device of the invention is deposition of a liftoff material. A liftoff material is deposited over the entire surface of dielectric layer 16 to form liftoff layer 18 of device 11. Liftoff layer 18 can be deposited by any method and can be formed from any suitable material.

Figure 8:
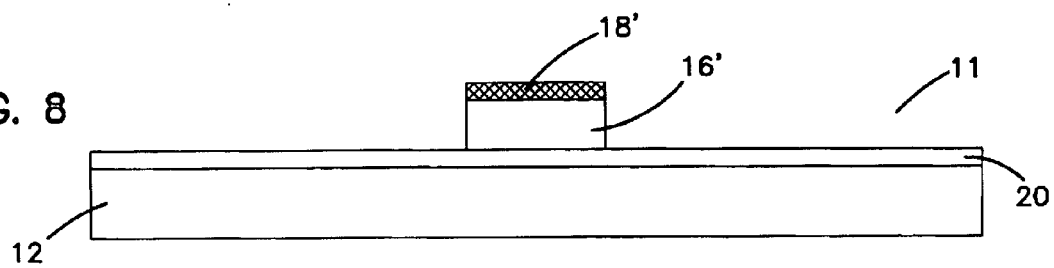

Referring to FIG. 8, the subsequent step in a method of producing a device of the invention is removal of layers. Patterned photoresist layer 14' is entirely removed, along with portions of dielectric layer 16 and liftoff layer 18. After this removal, all that remains on substrate 12 are layers 20, a portion of dielectric layer 16 positioned directly over laser area 13, called the dielectric mirror 16', and a portion of liftoff layer 18 positioned on top of dielectric mirror 16', called mirror layer. This removal step can be done by any method known to those skilled in the art.

Referring to FIG. 9, the next step in a method of producing device 11 of the invention is ion implantation. Ion implantation into substrate 12 creates implant regions 15 within layers 20. Ion implantation can be done by any method known to those skilled in the art, and any suitable ion can be implanted, including but not limited to, boron, indium, gallium, hydrogen, etc. Implant regions 15 are configured around aperture area 21 and do not penetrate aperture area 21 because of dielectric mirror 16' and mirror layer 18'. Generally, implant regions 15 are positioned just above the active region 103' (shown in FIG. 2). An example of conditions useful for implanting hydrogen ions to this shallow depth is at an energy of about 200 keV and a dose of $2.5 \times 10^{14}$. As discussed earlier, an alternative confinement technique suitable for use in the present invention is disclosed in U.S. Pat. No. 5,903,588 (Guenter et al.), which is incorporated by reference thereto.

Referring to FIG. 10, the next step in a method of producing device of the invention is deposition of an ohmic material on device 11. An ohmic material is deposited across the entire upper surface of the layers 20 to form ohmic metal layer 17. Ohmic metal layer 17 can be formed by any method known to those skilled in the art and can be formed from any suitable metal, including but not limited to, titanium (Ti), nickel (Ni), gold (Au), zinc (Zn) and platinum (Pt). Preferably, gold is used and is deposited from about 2500 to 10,000 Å. More preferably, the gold is deposited at about 8000 Å.

Referring to FIG. 11, the last step in a method of producing a device of the invention is removal of a portion of ohmic metal layer 17. A portion of ohmic metal layer 17 is removed (i.e., that portion above 18'), along with mirror layer 18' from above dielectric mirror 16', leaving ohmic metal 17'. Removal of these portions can be done by any method known to those skilled in the art.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A method of fabricating a laser, said method comprising the steps of:

(a) depositing a photoresist on epitaxially grown layers;

(b) patterning said photoresist to form an aperture area;

(c) depositing a dielectric material on said patterned photoresist;

(d) depositing a liftoff layer on said dielectric material;

(e) removing portions of said dielectric material and liftoff layer that border said aperture area;

(f) implanting regions of the epitaxially grown layers bordering said aperture area, wherein said remaining portion of said dielectric material and said liftoff layer serve as an implantation guide; and (g) depositing a metal layer on said dielectric material.

2. The method of claim 1, wherein said epitaxially grown layers comprise a bottom semiconductor Distributed Bragg Reflector stack, an active region and a partial top semiconductor Distributed Bragg Reflector stack.

3. The method of claim 2, wherein said top semiconductor Distributed Bragg Reflector stack contains material chosen from the group consisting of aluminum, gallium, arsenic, indium, phosphorus and combinations thereof.

4. The method of claim 3, wherein said top semiconductor Distributed Bragg Reflector stack comprises alternating layers of aluminum gallium arsenide and aluminum arsenide.

5. The method of claim 4, wherein said top semiconductor Distributed Bragg Reflector stack is doped.

6. The method of claim 2, wherein said top semiconductor Distributed Bragg Reflector stack has forty individual layers or less.

7. The method of claim 6, wherein said top semiconductor Distributed Bragg Reflector stack has twenty individual layers or less.

8. The method of claim 7, wherein said top semiconductor Distributed Bragg Reflector stack has eleven individual layers or less.

9. The method of claim 8, wherein said top semiconductor Distributed Bragg Reflector stack has seven individual layers or less.

10. The method of claim 1, wherein said dielectric material is chosen from the group consisting of silicon dioxide, titanium dioxide, silicon nitride, and combinations thereof.

11. The method of claim 10, wherein said dielectric material is chosen from the group consisting of silicon dioxide, titanium dioxide, and combinations thereof.

12. The method of claim 11, wherein said dielectric material is silicon dioxide.

13. The method of claim 1, wherein said laser is a vertical cavity surface emitting laser.

14. A laser resulting from the method of claim 1.

15. A method of fabricating a laser, the method comprising the steps of:
- forming a dielectric mirror on epitaxially grown layers in such a manner that the extent of the dielectric mirror is never larger than the laser aperture during fabrication, wherein the method of forming the dielectric mirror comprises:
  - depositing a photoresist on the epitaxially grown layers;
  - patterning the photoresist to form an aperture area;
  - depositing a dielectric material on the patterned photoresist;
  - depositing a liftoff layer on the dielectric material; and
  - removing portions of the dielectric material and liftoff layer that border the aperture area;
- implanting regions of the epitaxially grown layers bordering the aperture, wherein the remaining portion of the dielectric material and the liftoff layer serve as an implantation guide; and
- depositing a metal layer on the dielectric material.

16. The method of claim 15, wherein the epitaxially grown layers comprise a bottom semiconductor Distributed Bragg Reflector stack, an active region and a partial top semiconductor Distributed Bragg Reflector stack.

17. The method of claim 15, wherein the top semiconductor Distributed Bragg Reflector stack has eleven individual layers or less.

18. A method of fabricating a laser, the method comprising:
- depositing a photoresist on epitaxially grown layers, wherein the epitaxially grown layers comprise:
  - a bottom semiconductor Distributed Bragg Reflector stack;
  - an active region; and
  - a partial top semiconductor Distributed Bragg Reflector stack, wherein the top semiconductor Distributed Bragg Reflector stack has twenty individual layers or less and contains material chosen from the group consisting of aluminum, gallium, arsenic, indium, phosphorus, and combinations thereof;
- patterning the photoresist to form an aperture area;
- depositing a dielectric material on the patterned photoresist, wherein the dielectric material is chosen from the group consisting of silicon dioxide, titanium dioxide, silicon nitride, and combinations thereof;
- depositing a liftoff layer on teh dielectric material; and
- removing portions of the dielectric material and liftoff layer that border the aperture area;
- implanting with a damage implant regions of the epitaxially grown layers bordering the aperture but not penetrating the aperture, wherein the remaining portion of the dielectric material and the liftoff layer serve as an implantation guide; and
- depositing a metal layer on teh dielectric material.

19. The method of claim 18, wherein the top semiconductor Distributed Bragg Reflector stack has eleven individual layers or less.

* * * * *